United States Patent
Taimela et al.

(10) Patent No.: US 7,239,043 B2
(45) Date of Patent: Jul. 3, 2007

(54) POWER CONVERSION APPARATUS AND METHODS USING AN ADAPTIVE WAVEFORM REFERENCE

(75) Inventors: Pasi S. Taimela, Raleigh, NC (US); Kevin L. VanEyll, Angier, NC (US)

(73) Assignee: Eaton Power Quality Corporation, Cleveland, OH (US)

( * ) Notice: Subject to any disclaimer, the term of this patent is extended or adjusted under 35 U.S.C. 154(b) by 499 days.

(21) Appl. No.: 10/854,043

(22) Filed: May 26, 2004

(65) Prior Publication Data

US 2005/0275976 A1 Dec. 15, 2005

(51) Int. Cl.
H02J 7/00 (2006.01)
H02M 3/335 (2006.01)
G05B 13/02 (2006.01)

(52) U.S. Cl. .............................. 307/66; 363/25; 700/28
(58) Field of Classification Search .................. 307/66, 307/64, 65; 363/25; 323/285, 283; 700/28
See application file for complete search history.

(56) References Cited

U.S. PATENT DOCUMENTS

| | | | |
|---|---|---|---|
| 4,456,872 A | 6/1984 | Froeschle | |
| 5,126,585 A | 6/1992 | Boys | |
| 5,289,045 A | 2/1994 | Lavin et al. | |
| 5,345,165 A | 9/1994 | Froeschle | |
| 5,384,792 A | 1/1995 | Hirachi | |
| 5,612,580 A | 3/1997 | Janonis et al. | |

(Continued)

FOREIGN PATENT DOCUMENTS

EP 0 358 191 A2 9/1989

(Continued)

OTHER PUBLICATIONS

Chen, Yie-Tone, "Power Factor Correction of a Single-Phase On-Line UPS with the Half-Bridge Inverter," Proceedings of the 1996 IEEE IECON. 22nd International Conference on Industrial Electronics, Control and Instrumentation, vol. 3, 1996, pp. 1826-1831.

(Continued)

Primary Examiner—Shawn Riley
(74) Attorney, Agent, or Firm—Myers Bigel Sibley & Sajovec PA

(57) ABSTRACT

A power conversion apparatus, such as a UPS, includes a first waveform reference signal generator circuit operative to generate a first waveform reference signal responsive to an AC bus, and a second waveform reference signal generator circuit operative to generate a second waveform reference signal, e.g., a more consistently sinusoidal signal produced by another source. The apparatus further includes a control circuit that selectively generates a third waveform reference signal from the first and second waveform reference signals, and a power converter circuit (e.g., a rectifier and/or inverter) coupled to the AC bus and operative to transfer power to and/or from the AC bus responsive to the third waveform reference signal. In particular, the control circuit may be operative to weightedly combine the first and second waveform reference signals to generate the third waveform reference signal. The control circuit may weightedly combine the first and second waveform reference signals responsive to an operating parameter of the power converter, such as a voltage, a current, a power factor, a source impedance, a voltage distortion and/or a harmonic input current.

37 Claims, 7 Drawing Sheets

U.S. PATENT DOCUMENTS

| | | | |
|---|---|---|---|
| 5,633,789 A | 5/1997 | Kimura et al. | |
| 5,638,244 A | 6/1997 | Mekanik et al. | |
| 5,642,002 A | 6/1997 | Mekanik et al. | |
| 5,737,209 A | 4/1998 | Stevens | |
| 5,745,356 A | 4/1998 | Tassitino, Jr. et al. | |
| 5,747,887 A | 5/1998 | Takanaga et al. | |
| 5,764,496 A | 6/1998 | Sato et al. | |
| 5,771,161 A | 6/1998 | Jackson et al. | |
| 5,777,866 A | 7/1998 | Jacobs et al. | |
| 5,867,377 A | 2/1999 | Suranyi | |
| 5,949,662 A | 9/1999 | Boldin et al. | |
| 5,978,236 A | 11/1999 | Faberman et al. | |
| 6,052,292 A | 4/2000 | Podlesak | |
| 6,172,885 B1 * | 1/2001 | Feldtkeller | 363/21.1 |
| 6,295,215 B1 | 9/2001 | Faria et al. | |
| 6,295,216 B1 | 9/2001 | Faria et al. | |
| 6,411,067 B1 | 6/2002 | Bjorklund | |
| 2002/0153779 A1 | 10/2002 | Wade et al. | |

FOREIGN PATENT DOCUMENTS

| | | |
|---|---|---|
| EP | 0 431 778 A1 | 11/1990 |
| EP | 0 595 319 A2 | 5/1994 |
| WO | WO 2004/042908 A1 | 5/2004 |

OTHER PUBLICATIONS

Hirachi et al., "A High-Frequency-Linked Single Phase UPS with Power Factor Correction Scheme," IEEE Catalog No. 97$^{TH}$8280, ISIE '97, Guimaraes, Portugal, pp. 619-624.

Ho et al., "A New Single-Phase On-Line UPS Structure Pre-staged with PFC-and-Boost Converter," 1997 International Conference on Power Electronics and Drives Systems Proceedings, vol. 1, 1997, pp. 133-138.

International Search Report, PCT/US03/33858, Apr. 6, 2004.

Kamran, Farrukh, "A Novel On-Line UPS with Universal Filtering Capabilities," IEEE Transactions on Power Electronics, vol. 13, No. 3, May 1998, pp. 410-418.

Krishnan, R., "Design and Development of a High Frequency On-Line Uninterruptible Power Supply," Proceedings of the 1995 IEEE IECON 21$^{st}$ International Conference on Industrial Electronics, Control and Instrumentation, vol. 1 of 2, Plenary Session, Invited Sessions, and Power Electronics, pp. 578-583.

Levy, Aron, "Online UPSs Save 'Mission-Critical' Applications," Electronic Design, Sep. 1, 1998, vol. 46, pp. 109-117.

MacCleary, Randy, "On-Line or 'On-line', The Truth about UPS topologies," Telephony, Oct. 5, 1998, vol. 235, pp. PTN12-PTN14.

Marshall, G., "Uninterruptible Power Supplies Gear Up to Purge the Surges" Network Week, vol. 3, No. 43, INTELEC '82, Aug. 5, 1998, pp. 25-27.

Raddi et al., "A Utility Interactive PWM Sine-Wave Inverter Configured as a High Efficiency UPS," IEEE, 1982, pp. 42-48.

Rathman, Soren, "New Generation UPS Technology, The Delta Conversion Principle," Conference Record—IAS Annual Meeting (IEEE Industry Applications Society) v. 4, 1996, IEEE, Piscataway, NJ, pp. 2389-2395.

Wu et al, "A New UPS Scheme Provides Harmonic Suppression and Input Power Factor Correction," IEEE Transactions on Industrial Electronics, 42 (1995) December, No. 6, New York, pp. 629-635.

International Search Report, PCT/US2005/013954, Sep. 29, 2005.

* cited by examiner

POWER CONVERSION APPARATUS AND METHODS USING AN ADAPTIVE WAVEFORM REFERENCE

BACKGROUND OF THE INVENTION

The present invention relates to power conversion apparatus and methods, and more particularly, to AC power conversion apparatus and methods A power supply device, such as an uninterrupted power supply (UPS), may include an input rectifier that is used to generate DC voltage from an AC source (e.g., an AC utility). It is usually desirable that the rectifier circuit maintain a high waveform quality at the AC input, e.g., provide low harmonic currents and/or a power factor near unity (1). In some UPS, power factor control is achieved using a current-mode controlled pulse-width modulated (POM) rectifier, i.e., a rectifier that senses AC input current and responsively modulates the rectifier such that the AC input current waveform is substantially in phase with the AC input voltage. Such a conventional rectifier may sense the AC input voltage and appropriately scale and compensate it to generate a waveform reference for the current loop. Examples of such a control scheme are described in U.S. patent application Ser. No. 10/286,027 to Taimela, filed Nov. 1, 2002, and incorporated herein by reference in its entirety.

Such an approach can generally be effective, but the current loop may need relatively high bandwidth in order to track the AC voltage waveform when it is distorted. However, coupling of such a high bandwidth rectifier to a relatively high impedance source, such as a motor-generator set, can cause an input pole frequency of the rectifier to fall within the current loop bandwidth, which can lead to loop instability.

SUMMARY OF THE INVENTION

In some embodiments of the invention, a power conversion apparatus, such as a UPS, includes a first waveform reference signal generator circuit operative to generate a first waveform reference signal responsive to an AC bus, and a second waveform reference signal generator circuit operative to generate a second waveform reference signal, e.g., a sinusoidal reference signal. The apparatus further includes a control circuit that selectively generates a third waveform reference signal from the first and second waveform reference signals, and a power converter circuit (e.g., a rectifier and/or inverter) coupled to the AC bus and operative to transfer power to and/or from the AC bus responsive to the third waveform reference signal. In particular, the control circuit may be operative to weightedly combine the first and second waveform reference signals to generate the third waveform reference signal. The control circuit may weightedly combine the first and second waveform reference signals responsive to an operating parameter of the power converter, such as a voltage, a current, a power factor, a source or output impedance, a voltage distortion (e.g., total harmonic distortion or selected component thereof), pole frequency, and/or a harmonic input current.

In further embodiments of the invention, the control circuit is operative to estimate a source impedance at the AC bus. The control circuit weightedly combines the first and second waveform reference signals responsive to the estimated source impedance. The control circuit subsequently determines a waveform parameter and weightedly combines the first and second waveform reference signals responsive to the determined waveform parameter. The waveform parameter may include, for example, a voltage, a current, a power factor, an impedance, a pole frequency, a voltage distortion and/or a harmonic current. The control circuit may be operative to weight the second waveform reference signal proportionally to the determined source impedance.

In further embodiments of the invention, a power conversion apparatus, such as a UPS, includes a waveform reference signal generator circuit operative to generate a waveform reference signal responsive to an AC voltage on an AC bus and a sinusoidal signal generator circuit operative to generate a sinusoidal reference signal synchronized to the AC voltage. The apparatus further includes a control circuit operative to weightedly combine the waveform reference signal and the sinusoidal reference signal to generate a composite waveform reference signal, and a power converter circuit coupled to the AC bus and operative to transfer power to and/or from the AC bus responsive to the composite waveform reference signal.

In still further embodiments of the invention, power conversion methods are provided. A first waveform reference signal is generated responsive to an AC bus. A second waveform reference signal is generated, e.g., from a sinusoidal source. A third waveform reference signal is selectively generated from the first and second waveform reference signals, and power is transferred to and/or from the AC bus responsive to the third waveform reference signal.

Embodiments of the invention can provide various benefits. In some rectifier applications, for example, use of a composite waveform reference derived from the AC bus voltage and a sinusoidal reference can allow a power converter to stably operate over a wide range of input conditions while optimizing current waveform performance. In some embodiments, using a source impedance determination to generate an initial weighting of two waveform reference sources can allow a stable initial operating state to be attained, such that reference optimization based on waveform parameters, such as power factor, voltage distortion or harmonic current, can proceed.

DETAILED DESCRIPTION OF EXEMPLARY EMBODIMENTS

Figure 1:
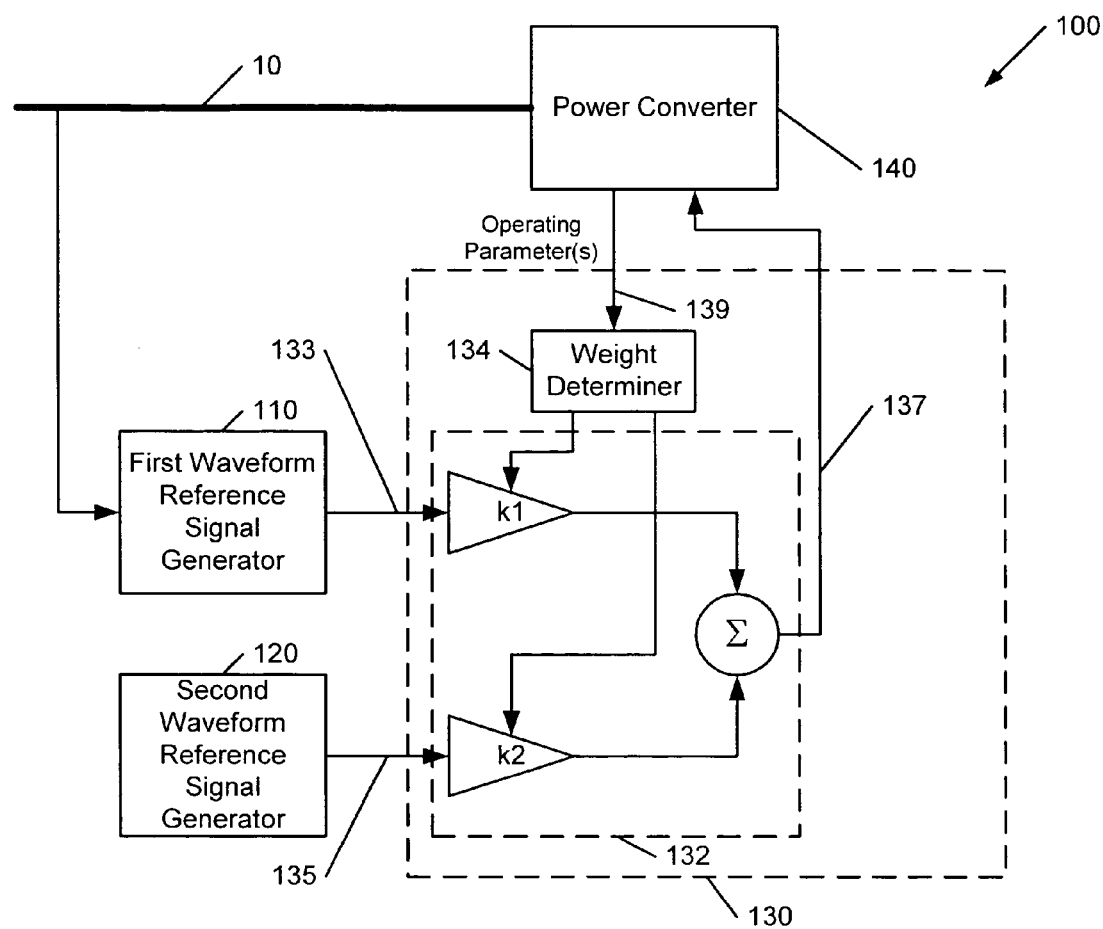
FIGS. 1-3 are schematic diagrams illustrating power conversion apparatus according various embodiments of the invention.

Specific exemplary embodiments of the invention now will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

As used herein, the terms "comprising", "comprises", "includes" and "including" are open-ended, i.e., refer to one or more stated elements, steps and/or functions without precluding one or more unstated elements, steps and/or functions. It will also be understood that the term "and/or" as used herein refers to and encompasses any and all possible combinations of one or more of the associated listed items. It will be understood that when an element is referred to as being "connected" or "coupled" to another element, it can be directly connected or coupled to the other element or intervening elements may be present. It will be further understood that when transfer, communication, or other interaction is described as occurring "between" elements, such transfer, communication or other interaction may be unidirectional and/or bidirectional.

Embodiments of the invention include circuitry configured to provide functions described herein. It will be appreciated that such circuitry may include analog circuits, digital circuits, and combinations of analog and digital circuits.

The present invention is described below with reference to block diagrams and/or operational illustrations of methods and wireless terminals according to embodiments of the invention. It will be understood that each block of the block diagrams and/or operational illustrations, and combinations of blocks in the block diagrams and/or operational illustrations, can be implemented by analog and/or digital hardware, and/or computer program instructions. These computer program instructions may be provided to a processor of a general purpose computer, special purpose computer, ASIC, and/or other programmable data processing apparatus, such that the instructions, which execute via the processor of the computer and/or other programmable data processing apparatus, create means for implementing the functions/acts specified in the block diagrams and/or operational illustrations. In some alternate implementations, the functions/acts noted in the figures may occur out of the order noted in the block diagrams and/or operational illustrations. For example, two operations shown as occurring in succession may, in fact, be executed substantially concurrently or the operations may sometimes be executed in the reverse order, depending upon the functionality/acts involved.

Computer program code for carrying out operations of the present invention may be written in an object oriented programming language such as Java®, Small talk or C++, a conventional procedural programming languages, such as the "C" programming language, or lower-level code, such as assembly language and/or micro code. The program code may execute entirely on a single processor and/or across multiple processors, as a stand-alone software package or as part of another software package.

FIG. 1 illustrates a power conversion apparatus 100 according to some embodiments of the invention. The apparatus 100 includes a first waveform reference signal generator circuit 110 that generates a first waveform reference signal 133 responsive to an AC bus 10. For example, in embodiments described below, the first waveform reference signal 133 may be a signal generated responsive to an AC voltage on the AC bus 10 and, thus, may reflect waveform characteristics of the AC voltage, which, at various times, may be substantially sinusoidal, quasi-sinusoidal or distorted from a sinusoidal character. The apparatus 100 further includes a second waveform reference signal generator circuit 120 that generates a second waveform reference signal 135. The second waveform reference signal 135 may, for example, be a more consistent, "idealized" sinusoidal signal from a synthetic source, such as an analog or digital waveform synthesizer related to the first waveform reference signal 135. It will be appreciated that each of the first and second waveform reference signals 133, 135 may be an analog signal or a digital signal, e.g., a sequence of digital values that piecewise approximates a sine waveform.

The apparatus 100 further includes a control circuit 130 that selectively generates a third waveform reference signal 137 for controlling a power converter circuit (e.g., a rectifier or inverter) from the first and second waveform reference signals 133, 135. As shown, the control circuit 130 includes a weighting factor determiner circuit 134 that determines weighting factors k1, k2 applied to the first and second waveform reference signals 133, 135 in a weighted combiner circuit 132 that produces the third waveform reference signal 137. In particular, the weighting factor determiner circuit 134 determines the weighting factors k1, k2 responsive to one or more operating parameters 139 associated with operation of the power converter circuit 140. Similar to the first and second waveform reference signals 133, 135, the third waveform reference signal 137 may be an analog signal or a digital signal.

As described below, in various embodiments of the invention, a waveform reference signal for a power converter coupled to an AC bus may represent an adaptively weighted combination of waveform information from the AC bus and waveform information derived from an alternative source, such as a waveform synthesizer. In UPS applications, for example, adaptive waveform reference control according to some embodiments of the invention can, for example, allow the UPS's AC input rectifier to adapt to changes in source impedance and/or quality of the AC voltage waveform. Such techniques may also be applied to other types of power converters, such as inverters for line-interactive UPSs, that use some type of AC waveform reference input for their control.

Figure 2:
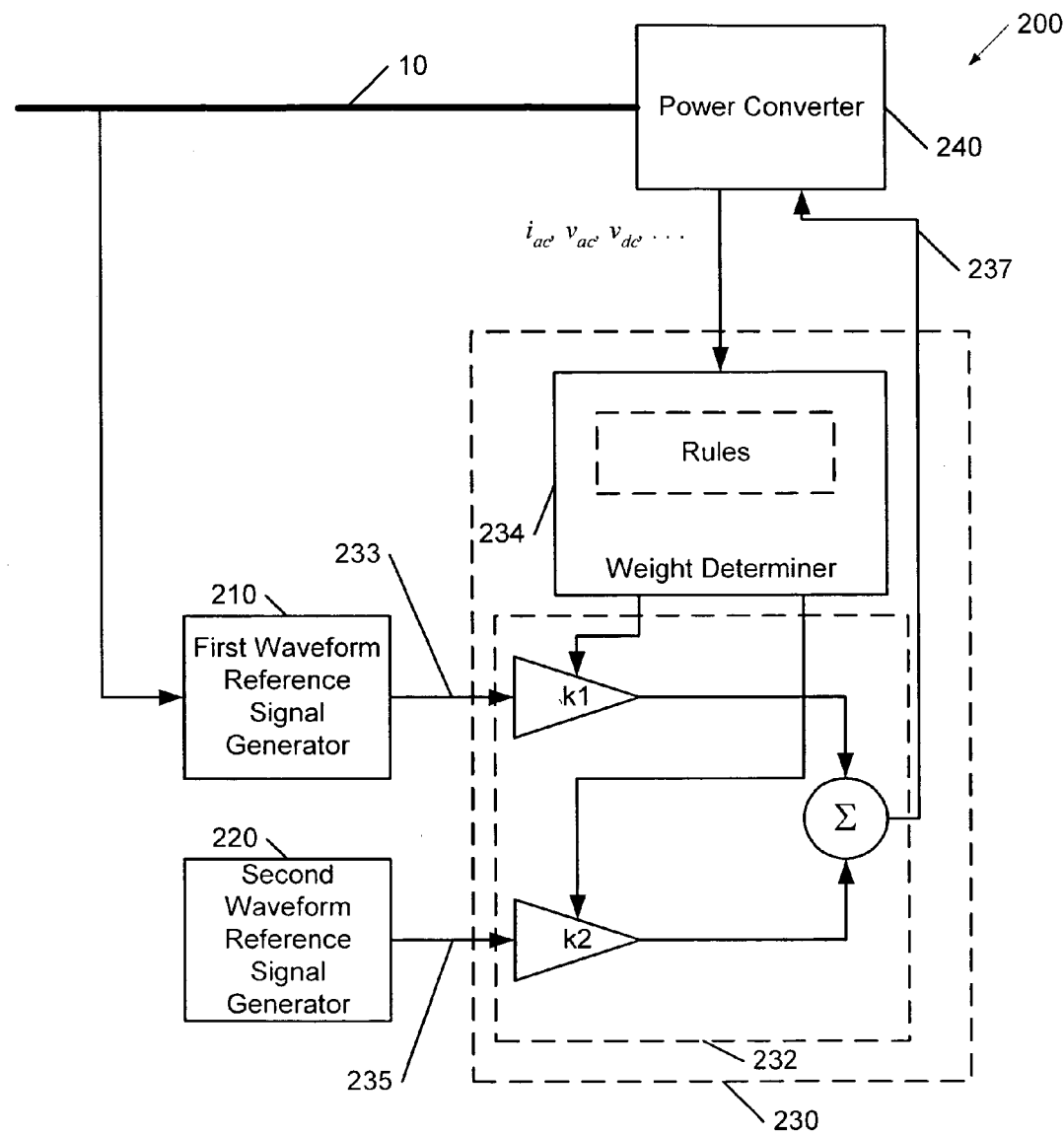

As shown in FIG. 2, a power conversion apparatus 200 according to further embodiments of the invention includes a first waveform reference signal generator circuit 210 that generates a first waveform reference signal 233 responsive to an AC bus 10, and a second waveform reference signal generator circuit 220 that generates a second waveform reference signal 235, e.g., a sinusoidal reference signal. A control circuit 230 includes a weighted combiner circuit 232 that weightedly combines the first and second waveform reference signals 233, 235 according to weighting factors k1, k2 to generate a third waveform reference signal 237 that is applied to a power converter 240 coupled to the AC bus 10. The weighting factors k1, k2 are determined by a weighting factor determiner circuit 234 responsive to operating parameters, such a AC current ($i_{ac}$) AC voltage ($v_{ac}$), DC voltage ($v_{dc}$), and/or parameters derived from currents and voltages, such as power factor. As shown, the weighting factor determiner circuit 234 determines the weighting factors k1, k2 based on rules that associate respective operating parameter states with respective weighting factor values. It will be appreciated that such rules may be embodied in many different forms, including formulae, lookups tables, logic structures, or the like.

Figure 3:
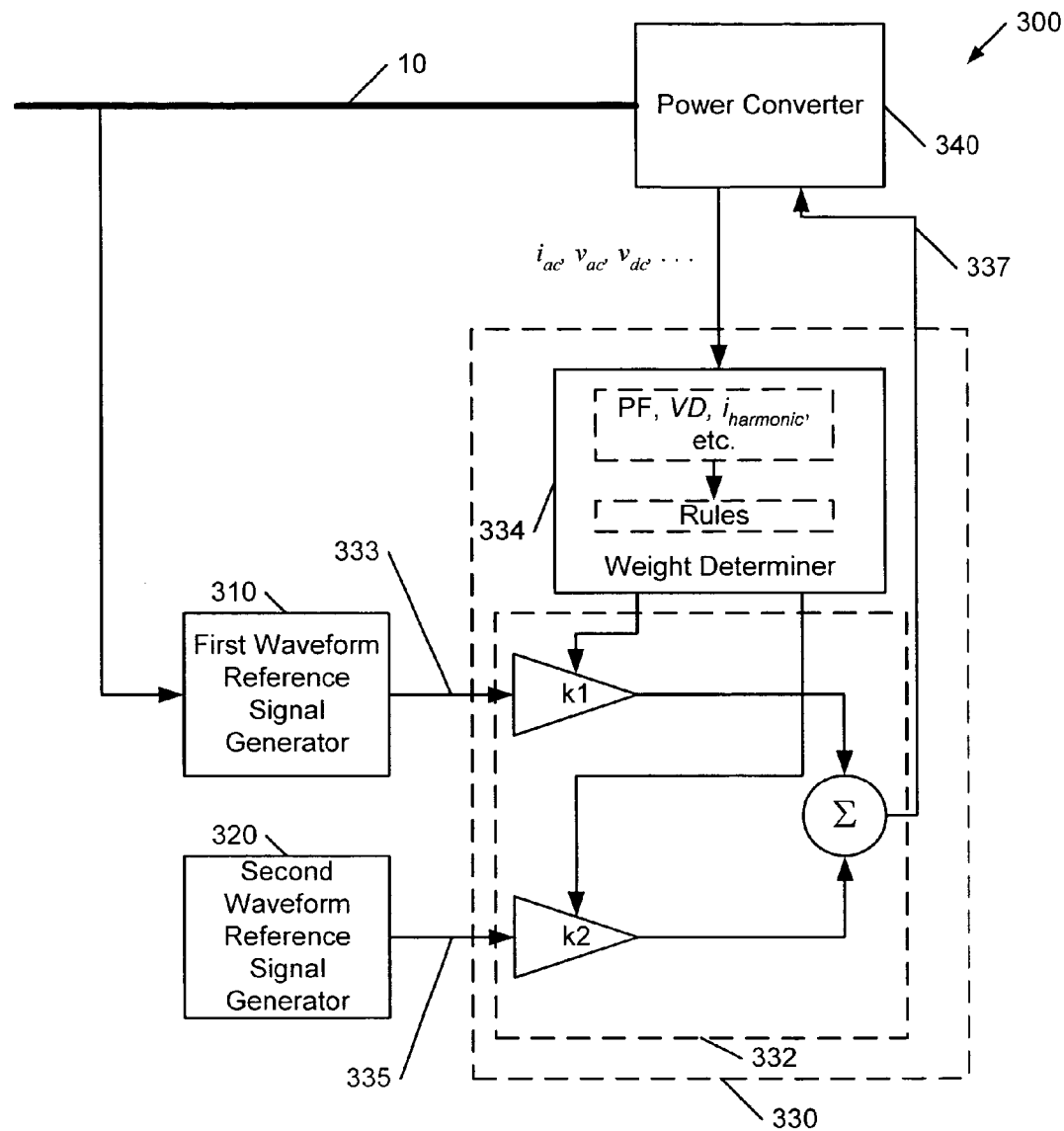

Referring to FIG. 3, a power conversion apparatus 300 according to still further embodiments of the invention includes a first waveform reference signal generator circuit 310 that generates a first waveform reference signal 333 responsive to an AC bus 10, and a second waveform reference signal generator circuit 320 that generates a second waveform reference signal 335, e.g., a sinusoidal reference signal. A control circuit 330 includes a weighted combiner circuit 332 that weightedly combines the first and second waveform reference signals 333, 335 according to weighting factors k1, k2 to generate a third waveform reference signal 337 that is applied to a power converter 240 coupled to the AC bus 10. The weighting factors k1, k2 are determined by a weighting factor determiner circuit 334 responsive to operating parameters, such as AC current ($i_{ac}$) AC voltage ($v_{ac}$), DC voltage ($v_{DC}$), and the like. More particularly, the weighting factor determiner circuit 334 determines one or more derived operating parameters, for example, parameters that are descriptive of waveform characteristics of voltage and/or current associated with the AC bus 10 or impact such characteristics, such as power factor (PF), voltage distortion (VD) (e.g., total harmonic distortion or a selected component thereof), source impedance, input pole frequency or harmonic input current ($i_{harmonic}$). The weighting factor determiner circuit 334 generates the weighting factors k1, k2 based on rules that associate respective derived operating parameter states (e.g., various combinations of power factor and input harmonic current levels) with respective weighting factor values.

Figure 4:
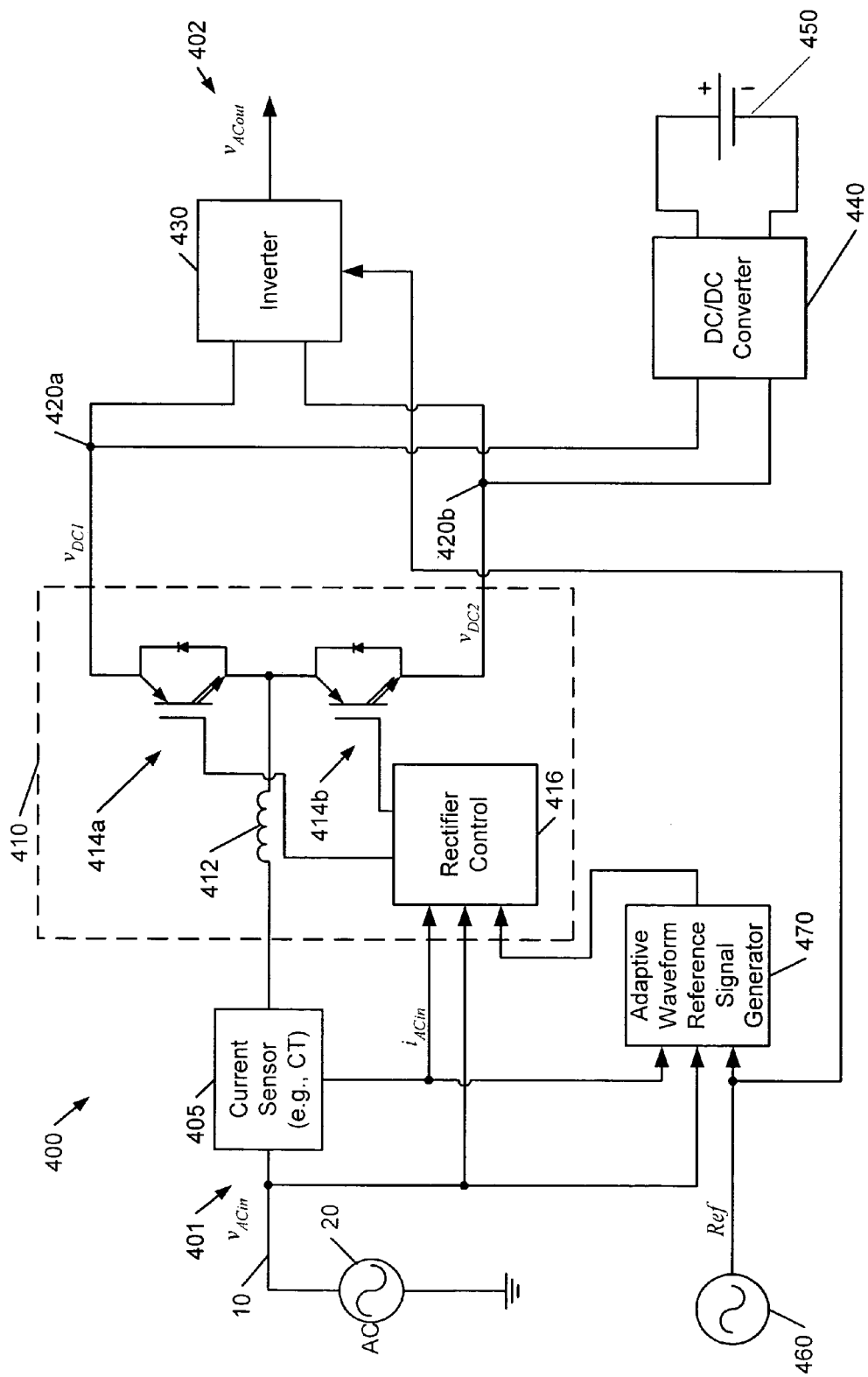
FIG. 4 is a schematic diagram illustrating a UPS according to some embodiments of the invention.

FIG. 4 illustrates an uninterrupted power supply (UPS) 400 according to further embodiments of the invention. The UPS 400 includes an input 401 configured to be coupled to an AC bus 10 (which is coupled to an AC power supply 20). The apparatus 400 also includes a series combination of a rectifier circuit 410, which includes an inductor 412, IGBTs 414a, 414b and a rectifier control circuit 416, and an inverter circuit 430, which is coupled to the rectifier circuit 410 by DC busses 420a, 420b and which produces an AC output voltage $v_{ACout}$ at an output 402. The rectifier circuit 410 produces positive and negative DC voltages $v_{DC1}$, $v_{DC2}$ on the DC busses 420a, 420b. The UPS 400 further includes an auxiliary DC power source coupled to the DC busses 420a, 420b. As shown, the auxiliary DC power source includes a battery 450 and a DC/DC converter circuit 440, but it will be understood that other types of auxiliary DC power sources may be used.

The transistors 414a, 414b of the rectifier circuit 410 are controlled by the rectifier control circuit 416 responsive to an input voltage $V_{ACin}$ at the input 401, to an input current $i_{in}$ sensed by a current sensor 405 and to a waveform reference signal Ref produced by an adaptive waveform reference signal generator circuit 470. More particularly, the rectifier control circuit 416 controls the current $i_{in}$ responsive to the waveform reference signal Ref to provide, for example, a desired power factor or other waveform characteristic at the input 401. The waveform reference signal Ref is selectively generated from the input voltage $v_{ACin}$, which serves as a first waveform reference signal, and a second waveform reference signal provided by a sinusoidal reference signal generator circuit 460. The second waveform reference signal produced by the reference signal generator circuit 460 may also be provided to the inverter 430 as a reference for generation of the AC output voltage $v_{ACout}$.

Figure 5:
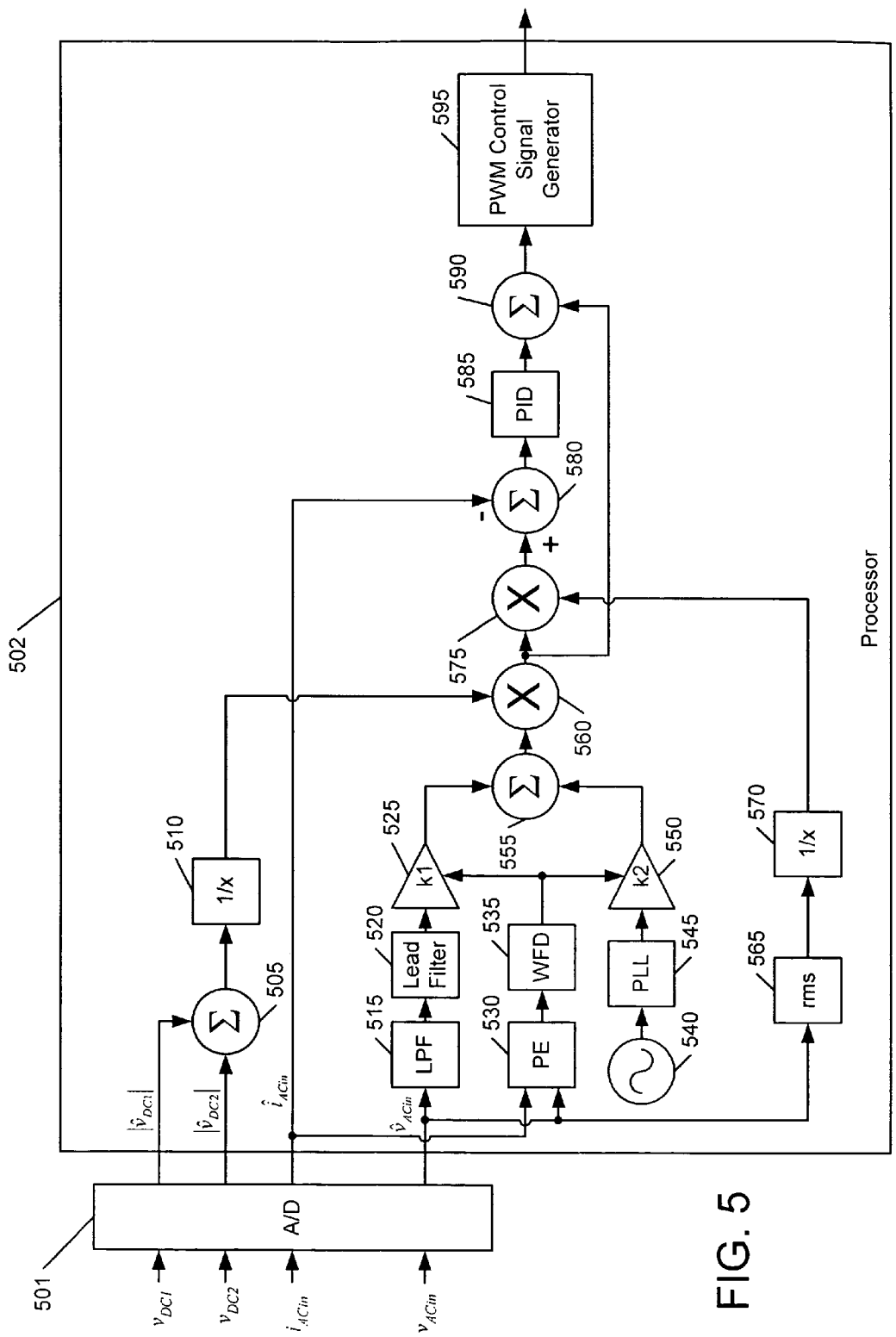
FIG. 5 is a schematic diagram illustrating a UPS rectifier control architecture according to further embodiments of the invention.

FIG. 5 illustrates a digital control architecture that may be used to provide rectifier control with an adaptive waveform reference along the lines illustrated in FIG. 4. An analog-to-digital (A/D) converter circuit 501 samples the AC input voltage $v_{ACin}$ and the AC input current $i_{ACin}$, and the DC voltages $v_{DC1}$, $v_{DC2}$ on the busses 420a, 420b, producing sampled signals $|\hat{v}_{DC1}|$, $|\hat{v}_{DC1}|$, $\hat{i}_{ACin}$, $\hat{v}_{ACin}$ that are passed to a processor 502, e.g., a microprocessor, microcontroller, digital signal processor (SP) or other computing device, in which blocks 505-595 are implemented. It will be understood that the sampled signals $|\hat{v}_{DC1}|$, $|\hat{v}_{DC1}|$, $\hat{i}_{ACin}$, $\hat{v}_{ACin}$ may also be scaled, filtered and/or otherwise processed in the A/D converter circuit 501.

In the processor 502, a first waveform reference signal is produced by filtering the sampled input voltage signal $\hat{v}_{ACin}$, in a low pass filter (LP) block 515 (e.g., a finite impulse response (FIR) filter or infinite impulse response (AIR) filter) to remove higher frequency components, and then filtering in a lead filter block 520 to compensate for a phase lag imparted by the LP block 515. A second waveform reference signal is produced from a sinusoidal signal produced from a sinusoidal signal generator block 540 that is phase locked to the input voltage $\hat{v}_{ACin}$ by a phase locked loop block 545.

The sampled input voltage signal $\hat{v}_{ACin}$ and the sampled input current signal $\hat{i}_{ACin}$ are also provided to a parameter estimator block 530 that is operative to estimate operating parameters associated with the converter operation, such as power factor, source impedance, harmonic input current, or the like. Responsive to the estimated operating parameter(s), a weighting factor determiner block 535 determines respective weighting factors k1, k2 to be applied in gain blocks 525, 550 to the respective waveform reference signals produced by the lead filter block 520 and the phase locked loop block 545. The weighted signals are applied to a summing block 555 to produce a composite waveform reference signal input to a multiplier block 560.

The sampled DC voltage signals $|\hat{v}_{DC1}|$, $|\hat{v}_{DC1}|$, are summed in a summing block 505, producing a signal that is inverted in an inversion block 510 and used to multiply the output of the summing block 555 in the multiplier block 560, thereby producing a first current command signal. The sampled input voltage signal $\hat{v}_{ACin}$ is also passed to a root mean square (arms) computation block 565, which produces a signal representative of an arms value of the input voltage signal $\hat{v}_{ACin}$. This arms voltage signal is then inverted in an inversion block 570, producing a signal that is multiplied in a multiplier block 575 by the first current command signal produced by the multiplier block 560, thus producing a normalized current reference signal. The sampled input current signal $\hat{i}_{ACin}$ is subtracted from the current reference signal in a summing block 580, producing an error signal that is applied to a proportional integrator-differentiate (PID) compensation block 585, which produces a second current command signal. The first and second current command signals produced by the multiplier block 560 and the PID compensation block 585, respectively, are summed in a summing block 590 to produce a composite current command signal that is applied to a PWM control signal generator block 595. The PWM control signal generator block 595 responsively generates control signals for the IGBT's 414a, 414b.

Figure 6:
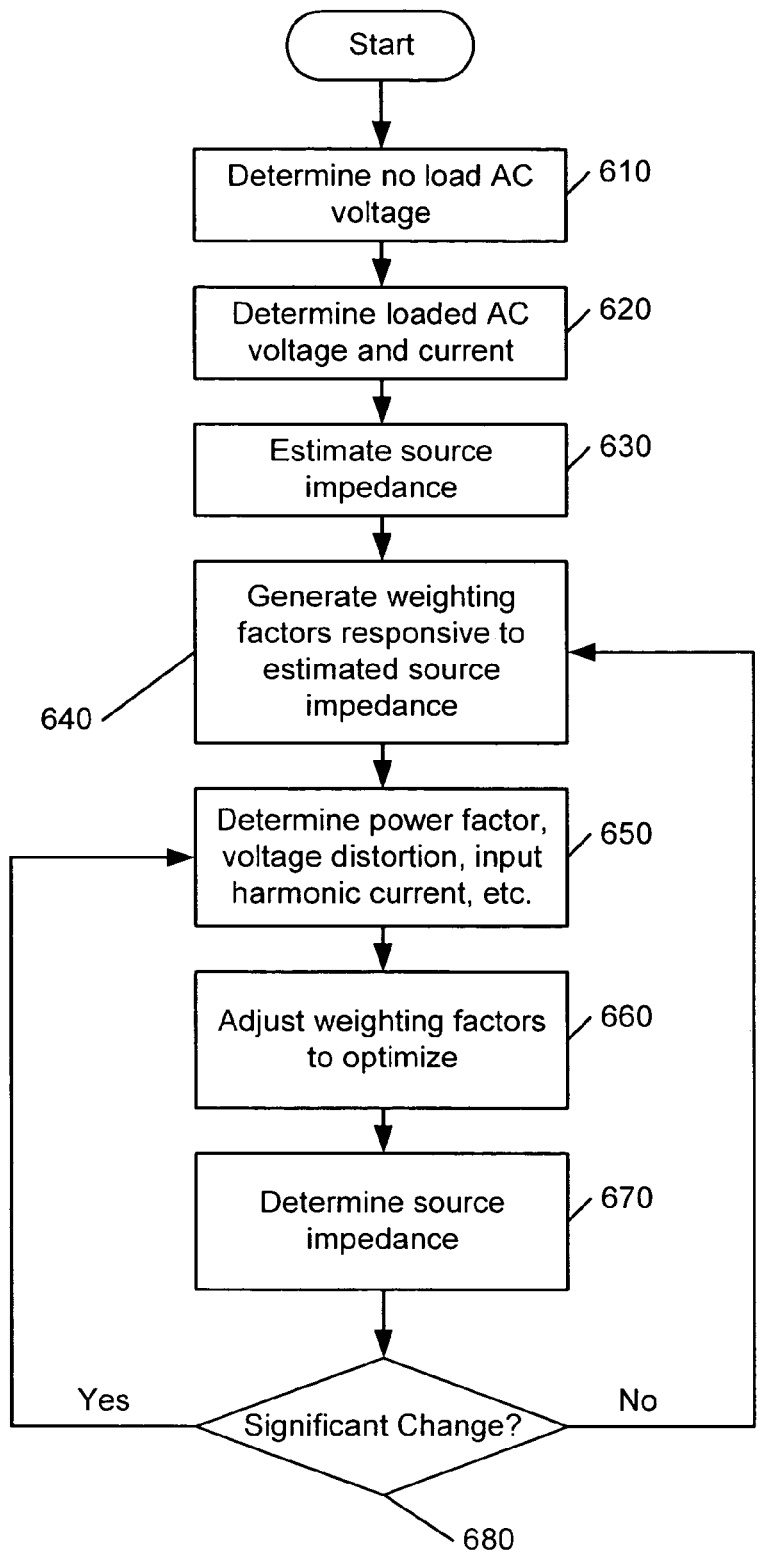
FIG. 6 is a flowchart illustrating exemplary UPS rectifier control operations according to additional embodiments of the invention.

FIG. 6 illustrates exemplary operations that may be provided by the architecture illustrated in FIG. 5 according to some embodiments of the invention. Referring to FIG. 6 with continuing reference to FIG. 5, in order to initialize control operation, the parameter estimator block 530 may determine no load voltage (Block 610) and loaded voltage and current (Block 620) and then determine source impedance $Z_s$ from these measurements (Block 630) according to the following equation:

$$|Z_s| = \frac{V_{ACin, noload} - V_{ACin, loaded}}{I_{loaded}}. \tag{1}$$

The weighting factor determiner block 535 may then responsively determine initial values for the weighting factors k1, k2 from the estimated source impedance (Block 640). As noted below, post-initialization source impedance determinations may also be used to optimize for variations in source impedance that arise from loading changes that introduce non-linearities (e.g., inductor saturation).

The source impedance $Z_s$ typically is dominated by an inductance $L_s$ that may be approximated by:

$$L_s = \frac{|Z_s|}{\omega}, \quad (2)$$

where ω is the frequency (fundamental) of the AC input. In some embodiments of the invention, an input pole frequency $\omega_p$ for the rectifier may be explicitly calculated from the estimate of the source inductance and the known input capacitance $C_i$ of the rectifier circuit using the following equation:

$$\omega_p = \frac{1}{\sqrt{L_s \times C_i}}. \quad (3)$$

Values of the weighting factors k1, k2 that produce an acceptable damping at this frequency may then be determined. For example, a lookups table that correlates respective pole frequency values with respective values for the weighting factors k1, k2 could be used to select appropriate weighting factor values. Such a table could be generated, for example, from experiment and/or simulation. In some embodiments of the invention, if the weighting factors k1, k2 are related such that:

$$k2 = \alpha - k1, \quad (4)$$

where a is a known value, an acceptable initial value for k2 may be obtained in a simpler fashion by selecting select a value for k2 proportional to $\sqrt{L_s}$, without requiring explicit estimation of a pole frequency. The initial value for k1 can then be determined from k2 according to equation (4). These initial values, which may be suboptimal, can allow the rectifier to run stably, i.e., without oscillation, such that an iterative process can be then be initiated to determine more optimal values.

For example, as shown in FIG. 6, as operation of the rectifier proceeds, the parameter estimator block 530 may iteratively estimate power factor, voltage distortion, input harmonic current, source impedance, pole frequency, and/or some other operating parameter(s) (Block 650) and responsively adjust the values of the weighting factors k1, k2 to optimize based on the parameter(s) being monitored (Block 660). The source impedance may also be periodically evaluated (Block 670) to determine, for example, if a new source is present. If a significant change indicative of a change in source is detected (Block 680), a re-initialization of the weighting factors based on source impedance may be performed (Block 640). The re-initialization of the weighting factors based on source impedance may occur at a lower rate than adjustments made based on the other operating parameters (e.g., power factor), as step changes in source impedance may be likely to occur at a much lower frequency. A change in source may be also be signaled by some other event, such as a change in state of a transfer switch.

Therefore, in alternative embodiments of the invention, such an event may be used to trigger a re-estimation of source impedance and re-initialization of weighting factors.

It will be appreciated, that optimization may occur with respect to any individual operating parameter and/or a combination of operating parameters, and that the operating parameter(s) may change with state changes of the apparatus. Optimization operations may be performed using a variety of different techniques, such as formulas, lookups tables, and/or fuzzy logic.

Figure 7:
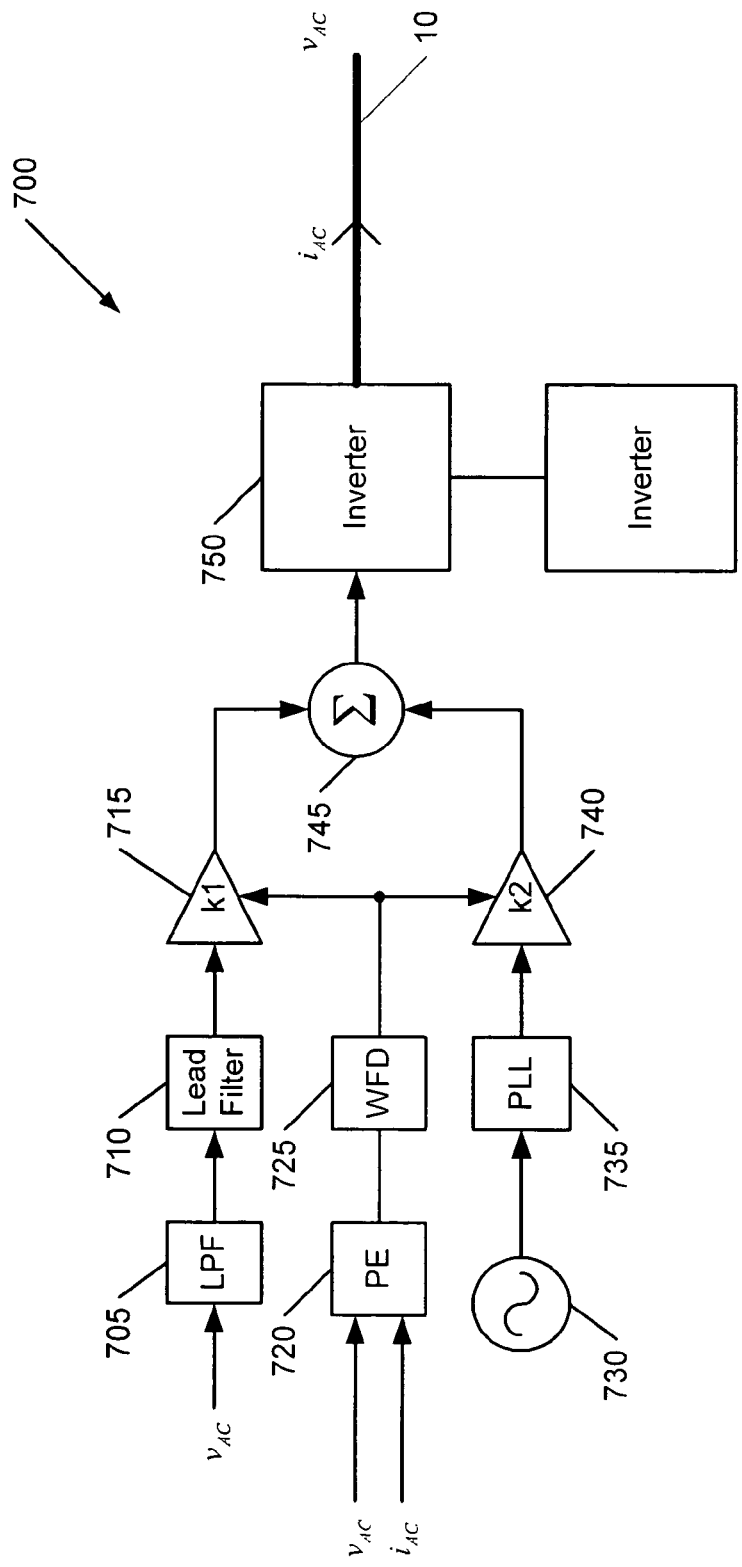
FIG. 7 is a schematic diagram illustrating an inverter control architecture according to still further embodiments of the invention.

It will be further appreciated that the invention is also applicable to control of power converters other than rectifiers. For example, as shown in FIG. 7, an inverter 750 of a line interactive UPS 700 can be controlled using a waveform reference generated in a manner similar to that described above with reference to FIGS. 4-6. IN the UPS 700, a first waveform reference signal is produced by filtering an AC voltage signal $v_{AC}$ representing an AC voltage on an AC bus 10 in a low pass filter (LF) block 705 (e.g., an finite impulse response (FIR) filter or infinite impulse response (IIR) filter) to remove higher frequency components, and then filtering in a lead filter block 710 to compensate for a phase lag imparted by the LPF block 705. A second waveform reference signal is produced from a sinusoidal signal produced from a sinusoidal signal generator block 730 that is phase locked to the AC voltage signal $v_{AC}$ by a phase locked loop block 735.

The AC voltage signal $v_{AC}$ and an AC signal $i_{AC}$ are provided to a parameter estimator block 720 that is operative to estimate operating parameters associated with operation of the inverter 750, such as power factor, output impedance, output voltage harmonic distortion, or the like. Responsive to the estimated operating parameter(s), a weighting factor determiner block 725 determines respective weighting factors k1, k2 to be applied in gain blocks 715, 740 to the respective waveform reference signals produced by the lead filter block 710 and the phase locked loop block 735. The weighted signals are applied to a summing block 745 to produce a composite waveform reference signal input to the inverter 750. The inverter 750 responsively transfers power between the AC bus 10 and a DC source 760 (e.g., a battery). It will be appreciated that the control circuitry illustrated in FIG. 7 may be analog and/or digital, and that control techniques along the lines of the initialization and adaptation techniques described above with reference to FIG. 6 may be used in applications such at that illustrated in FIG. 7. It will be further understood that control techniques along the lines described herein may also be used to control inverters and/or rectifiers in other applications within the scope of the present invention.

In the drawings and specification, there have been disclosed exemplary embodiments of the invention. Although specific terms are employed, they are used in a generic and descriptive sense only and not for purposes of limitation, the scope of the invention being defined by the following claims.

That which is claimed:

1. A power conversion apparatus, comprising:
   a first waveform reference signal generator circuit operative to generate a first waveform reference signal responsive to an AC bus;
   a second waveform reference signal generator circuit operative to generate a second waveform reference signal;
   a control circuit that selectively generates a third waveform reference signal from the first and second waveform reference signals; and a power converter circuit coupled to the AC bus and operative to transfer power to and/or from the AC bus responsive to the third waveform reference signal.

2. An apparatus according to claim 1, wherein the control circuit is operative to weightedly combine the first and second waveform reference signals to generate the third waveform reference signal.

3. An apparatus according to claim 2, wherein the control circuit is operative to weightedly combine the first and second waveform reference signals responsive to an operating parameter of the power converter.

4. An apparatus according to claim 3, wherein the control circuit comprises:
a weighting factor determiner circuit operative to determine respective weighting factors for the respective first and second waveform reference signals responsive to the operating parameter; and
a combiner circuit operative to generate the third waveform reference signal from the first and second waveform reference signals according to the determined weighting factors.

5. An apparatus according to claim 4, wherein the operating parameter comprises a voltage, a current, a power factor, an impedance, a pole frequency, a voltage distortion and/or a harmonic current.

6. An apparatus according to claim 4, wherein the weighting factor determiner circuit is operative to determine the weighting factors according to one or more predetermined rules that associate respective weighting factor values with respective operating parameter states.

7. An apparatus according to claim 2, wherein the control circuit is operative to estimate a source impedance at the AC bus, to weightedly combine the first and second waveform reference signals responsive to the estimated source impedance, and to subsequently determine a waveform parameter and weightedly combine the first and second waveform reference signals responsive to the determined waveform parameter.

8. An apparatus according to claim 7, wherein the waveform parameter comprises a voltage, a current, a power factor, an impedance, a pole frequency, a voltage distortion and/or a harmonic current.

9. An apparatus according to claim 7, wherein the control circuit is operative to weight the second waveform reference signal proportionally to the estimated source impedance.

10. An apparatus according to claim 7, wherein the control circuit is operative to estimate a pole frequency from the estimated source impedance and to weight the first and second waveform references responsive to the estimated pole frequency.

11. An apparatus according to claim 2, wherein the second waveform reference signal generator circuit is operative to synchronize the second waveform reference signal to the AC voltage on the AC bus.

12. An apparatus according to claim 11, wherein the second waveform reference signal generator circuit comprises:
a sinusoidal signal generator circuit that produces a sinusoidal signal; and
a phase locked loop circuit that receives the sinusoidal signal and generates the second waveform reference signal from the sinusoidal reference signal responsive to the AC voltage on the AC bus.

13. An apparatus according to claim 2 wherein the power converter circuit comprises a rectifier and/or an inverter.

14. An apparatus according to claim 2, wherein the power converter comprises a current-mode controlled converter.

15. A power conversion apparatus, comprising:
a waveform reference signal generator circuit operative to generate a waveform reference signal responsive to an AC voltage on an AC bus;
a sinusoidal signal generator circuit operative to generate a sinusoidal reference signal synchronized to the AC voltage;
a control circuit operative to weightedly combine the waveform reference signal and the sinusoidal reference signal to generate a composite waveform reference signal; and
a power converter circuit coupled to the AC bus and operative to transfer power to and/or from the AC bus responsive to the composite waveform reference signal.

16. An apparatus according to claim 15, wherein the control circuit is operative to weightedly combine the waveform reference signal and the sinusoidal reference signal responsive to an operating parameter of the power converter.

17. An apparatus according to claim 16, wherein the operating parameter comprises a voltage, a current, a power factor, an impedance, a pole frequency, a voltage distortion and/or a harmonic current.

18. An apparatus according to claim 15, wherein the control circuit is operative to estimate a source impedance at the AC bus, to weightedly combine the waveform reference signal and the sinusoidal reference signal responsive to the estimated source impedance, and to subsequently determine a waveform parameter and weightedly combine the waveform reference signal and the sinusoidal reference signal responsive to the determined waveform parameter.

19. An apparatus according to claim 18, wherein the waveform parameter comprises a voltage, a current, a power factor, an impedance, a pole frequency, a voltage distortion and/or a harmonic current.

20. An apparatus according to claim 15, wherein the power converter circuit comprises a rectifier and/or an inverter.

21. An uninterrupted power supply (UPS), comprising:
a waveform reference signal generator circuit operative to generate a waveform reference signal responsive to an AC voltage on an AC bus;
a sinusoidal signal generator circuit operative to generate a sinusoidal reference signal synchronized to the AC voltage;
a control circuit operative to weightedly combine the waveform reference signal and the sinusoidal reference signal to generate a composite waveform reference signal; and
a power converter circuit coupled to the AC bus and operative to transfer power to and/or from the AC bus responsive to the composite waveform reference signal.

22. A UPS according to claim 21, wherein the control circuit is operative to weightedly combine the waveform reference signal and the sinusoidal reference signal responsive to a voltage, a current, a power factor, an impedance, a pole frequency, a voltage distortion and/or a harmonic current.

23. A UPS according to claim 21, wherein the control circuit is operative to estimate a source impedance at the AC bus, to weightedly combine the waveform reference signal and the sinusoidal reference signal responsive to the estimated source impedance, and to subsequently determine a waveform parameter and weightedly combine the waveform reference signal and the sinusoidal reference signal responsive to the determined waveform parameter.

24. A UPS according to claim 23, wherein the waveform parameter comprises a voltage, a current, a power factor, an impedance, a pole frequency, a voltage distortion and/or a harmonic current.

25. A UPS according to claim 21, wherein the power converter circuit comprises a rectifier and/or an inverter.

26. A power conversion method, comprising:
generating a first waveform reference signal responsive to an AC bus;
generating a second waveform reference signal;
selectively generating a third waveform reference signal from the first and second waveform reference signals;
transferring power to and/or from the AC bus responsive to the third waveform reference signal.

27. A method according to claim 26, wherein selectively generating a third waveform reference signal from the first and second waveform reference signals comprises weightedly combining the first and second waveform reference signals to generate the third waveform reference signal.

28. A method according to claim 27, wherein transferring power to and/or from the AC bus responsive to the third waveform reference signal comprises applying the third waveform reference signal to a power converter coupled to the AC bus, and wherein weightedly combining the first and second waveform reference signals to generate the third waveform reference signal comprises weightedly combining the first and second waveform reference signals responsive to an operating parameter of the power converter.

29. A method according to claim 28, wherein weightedly combining the first and second waveform reference signals responsive to an operating parameter of the power converter comprises:
determining respective weighting factors for the respective first and second waveform reference signals responsive to the operating parameter; and
weightedly combining the first and second waveform reference signals according to the determined weighting factors.

30. A method according to claim 29, wherein the operating parameter comprises a voltage, a current, a power factor, an impedance, a pole frequency, a voltage distortion and/or a harmonic current.

31. A method according to claim 29 wherein determining respective weighting factors for the respective first and second waveform reference signals responsive to the operating parameter comprises determining the weighting factors according to one or more predetermined rules that associate respective weighting factor values with respective operating parameter states.

32. A method according to claim 27, wherein weightedly combining the first and second waveform reference signals to generate the third waveform reference signal comprises:
estimating a source impedance at the AC bus;
weightedly combining the first and second waveform reference signals responsive to the estimated source impedance;
determining a waveform parameter for the AC bus; and
weightedly combine the first and second waveform reference signals responsive to the determined waveform parameter.

33. A method according to claim 32, wherein the waveform parameter comprises a voltage, a current, a power factor, an impedance, a pole frequency, a voltage distortion and/or a harmonic current.

34. A method according to claim 32, wherein weightedly combining the first and second waveform reference signals responsive to the estimated source impedance comprises weighting the second waveform reference signal proportionally to the determined source impedance.

35. A method according to claim 32 further comprising wherein weightedly combining the first and second waveform reference signals responsive to the estimated source impedance comprises estimating a pole frequency from the estimated source impedance and weighting the first and second waveform references responsive to the estimated pole frequency.

36. A method according to claim 27, further comprising synchronizing the second waveform reference signal to an AC voltage on the AC bus.

37. A method according to claim 27, wherein transferring power to and/or from the AC bus responsive to the third waveform reference signal comprises applying the third waveform reference signal to a rectifier and/or an inverter coupled to the AC bus.

* * * * *